(12) United States Patent
Rutter et al.

(10) Patent No.: US 9,941,265 B2
(45) Date of Patent: Apr. 10, 2018

(54) CIRCUITRY WITH VOLTAGE LIMITING AND CAPACITIVE ENHANCEMENT

(71) Applicant: Nexperia B.V., Nijmegen (NL)

(72) Inventors: Philip Rutter, Stockport (GB); Jan Sonsky, Leuven (BE); Barry Wynne, Stockport (GB); Yan Lai, Stockport (GB); Steven Thomas Peake, Warrington (GB)

(73) Assignee: Nexperia B.V., Nimegen (NA)

( * ) Notice: Subject to any disclaimer, the term of this patent is extended or adjusted under 35 U.S.C. 154(b) by 0 days.

(21) Appl. No.: 15/200,308

(22) Filed: Jul. 1, 2016

(65) Prior Publication Data

US 2018/0006015 A1    Jan. 4, 2018

(51) Int. Cl.
  *H01L 29/76* (2006.01)
  *H01L 27/02* (2006.01)
  *H01L 27/06* (2006.01)
  *H01L 29/06* (2006.01)
  *H01L 21/768* (2006.01)

(52) U.S. Cl.
  CPC .... *H01L 27/0255* (2013.01); *H01L 21/76877* (2013.01); *H01L 27/0629* (2013.01); *H01L 29/063* (2013.01); *H01L 29/0626* (2013.01)

(58) Field of Classification Search
  CPC . H01L 27/0629; H01L 29/2003; H01L 28/20; H01L 27/0605; H03K 17/567
  USPC ........................................................ 257/367
  See application file for complete search history.

(56) References Cited

U.S. PATENT DOCUMENTS

| 9,171,837 B2 | 10/2015 | Rutter et al. | |
| 9,268,351 B2 | 2/2016 | Rutter et al. | |
| 2004/0038467 A1* | 2/2004 | Darwish | H01L 21/2253 438/197 |
| 2010/0072544 A1* | 3/2010 | Pearse | H01L 29/407 257/331 |
| 2011/0210338 A1 | 9/2011 | Briere | |

(Continued)

FOREIGN PATENT DOCUMENTS

| EP | 2256799 A2 | 12/2010 |
| EP | 2546883 A2 | 1/2013 |

(Continued)

OTHER PUBLICATIONS

European Search Report for the corresponding application EP17171149, 2 pages, dated Nov. 28, 2017.

*Primary Examiner* — Andy Huynh
(74) *Attorney, Agent, or Firm* — Ohlandt, Greeley, Ruggiero & Perle L.L.P.

(57) ABSTRACT

Aspects of the present disclosure are directed to circuitry operable with enhanced capacitance and mitigation of avalanche breakdown. As may be implemented in accordance with one or more embodiments, an apparatus and/or method involves respective transistors of a cascode circuit, one of which controls the other in an off state by applying a voltage to a gate thereof. A plurality of doped regions are separated by trenches, with the conductive trenches being configured and arranged with the doped regions to provide capacitance across the source and the drain of the second transistor, and restricting voltage at one of the source and the drain of the second transistor, therein mitigating avalanche breakdown of the second transistor.

14 Claims, 5 Drawing Sheets

(56) References Cited

U.S. PATENT DOCUMENTS

2012/0241756 A1    9/2012   Zhang et al.
2014/0292287 A1   10/2014   Rutter et al.

FOREIGN PATENT DOCUMENTS

EP           2736073 A1   5/2014
WO    2008063592 A2   5/2008

* cited by examiner

CIRCUITRY WITH VOLTAGE LIMITING AND CAPACTIVE ENHANCEMENT

OVERVIEW

Aspects of various embodiments are directed to circuits providing voltage clamping and capacitance, such as may be implemented for controlling high voltage devices.

Many devices employ switching type circuits, as may be implemented in a variety of manners. For instance, high voltage switches can be desirably used with related circuitry. In some applications, a normally on device (transistor) is used with high voltages by coupling an additional device that results in net operation as being normally off. One such approach involves using a cascode arrangement with a low voltage FET (field effect transistor) coupled to a high voltage device to provide a controlling gate voltage.

While such devices are useful, certain conditions can cause excess voltage, which can harm either or both of the high voltage device and the low voltage FET. For example, if leakage in the high voltage device is higher than that of the low voltage FET, or the low voltage FET switches off faster than the high voltage device, operation and reliability issues may arise.

These and other matters have presented challenges to the manufacture and implementation of such devices, for a variety of applications.

SUMMARY

Various example embodiments are directed to issues such as those addressed above and/or others which may become apparent from the following disclosure concerning the operation of transistor circuits, such as those involving high voltage transistors. In various implementations, normally on transistors are controlled using a low-voltage transistor with enhanced capacitance and mitigation of avalanche breakdown.

In certain example embodiments, aspects of the present disclosure involve the use of semiconductor structures that provide enhanced capacitance and avalanche breakdown control. Such aspects may be implemented with doped regions separated by trenches, which can further be formed in process steps shared with the formation of the transistors themselves.

In accordance with a particular embodiment, an apparatus includes a cascode circuit having first and second transistors each having a gate, a source, a channel and drain, with the drain of the second transistor electrically connected to the source of the first transistor. The second transistor is operable and connected to control the first transistor in an off state by applying a voltage to the gate thereof. The apparatus also includes a plurality of conductive trenches and one or more doped regions, between adjacent ones of the conductive trenches and providing a p-n junction. The conductive trenches are configured and arranged with the doped regions to provide capacitance across the source and the drain of the second transistor, and mitigate avalanche breakdown of the second transistor by restricting voltage at one of the source and the drain of the second transistor (e.g., by clamping voltage).

Another embodiment is directed to a method, which may be implemented with circuitry as noted above. First and second transistors are provided for a cascode circuit, each having a gate, a source, a channel and a drain, with the drain of the second transistor electrically connected to the source of the first transistor. A plurality of conductive trenches along with one or more doped regions between each adjacent trench are connected to the source and drain of the second transistor. The second transistor is utilized for controlling the first transistor in an off state by applying a voltage to the gate of the first transistor, and the conductive trenches and the doped regions are used to both provide capacitance across the source and the drain of the second transistor and mitigate avalanche breakdown of the second transistor. Avalanche breakdown can be mitigated in this context by limiting, or clamping, voltage at one of the source and the drain of the second transistor.

In other specific example embodiments, an apparatus includes a cascode circuit, a capacitor circuit and a clamp diode circuit. The cascode circuit includes a high-voltage GaN transistor having a gate, a source, a drain and a channel that connects its source and drain. The cascode circuit also includes a low-voltage FET having a gate, a source connected to the gate of the high-voltage GaN transistor, a drain connected to the source of the high-voltage GaN transistor, and a channel that connects its source and drain. The capacitor and clamp diode circuits are connected to the source and to the drain of the low-voltage FET transistor. In certain embodiments, the low-voltage FET controls the high-voltage GaN transistor in an OFF state by applying the voltage at its source to the gate of the high-voltage GaN transistor, while the capacitor and the clamp diode provide capacitance across the source and the drain of the low-voltage FET, and mitigate avalanche breakdown of the low-voltage FET by clamping voltage across the source and the drain.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
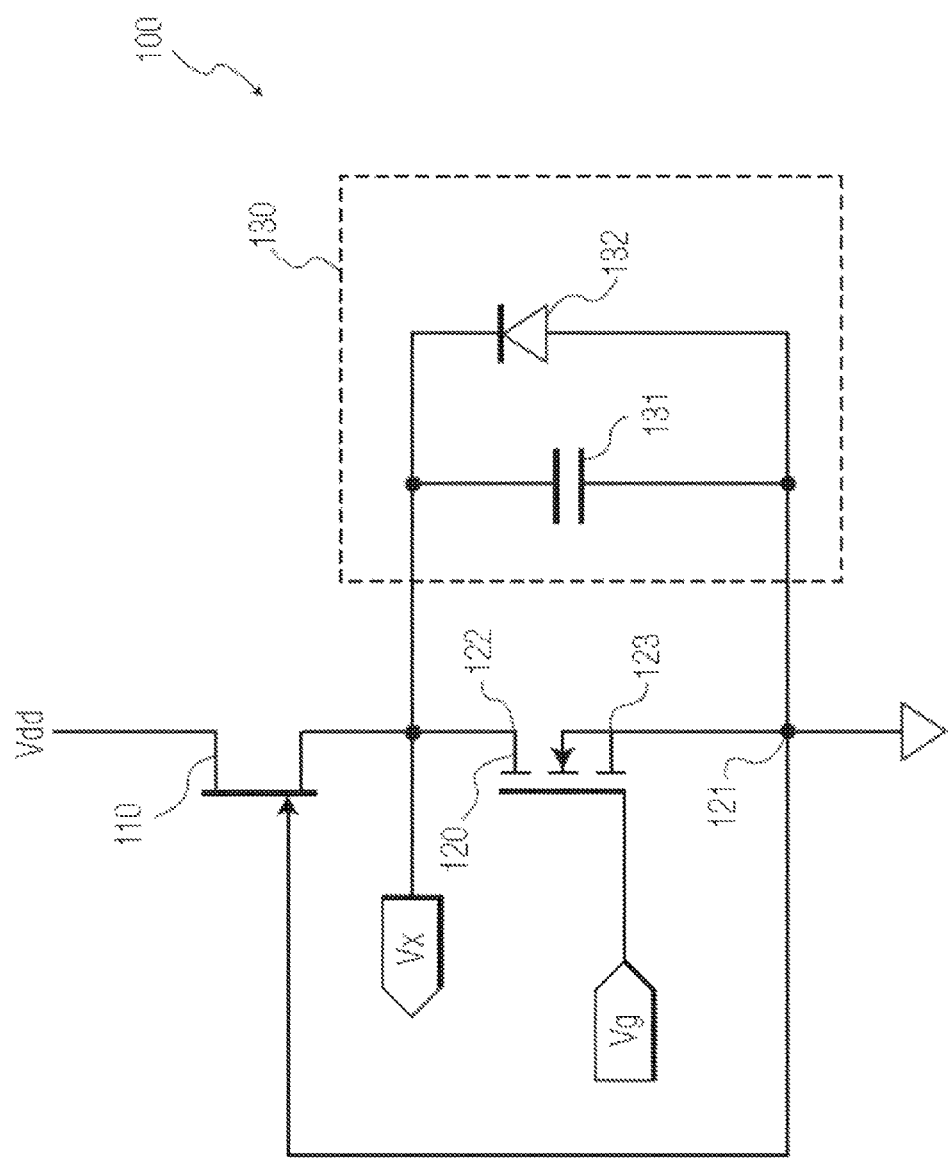
FIG. 1 shows an apparatus in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving overvoltage suppression or other voltage control. In certain implementations, aspects of the present disclosure have been shown to be beneficial when used in the context of overvoltage suppression in circuits such as cascaded circuits, as may be implemented in a variety of types of circuits and related devices/systems. In some embodiments, circuitry operable with a low-voltage switch provides additional drain-source capacitance for the switch as well as clamping functions. Such circuitry may be implemented with a normally on switch or transistor (e.g., at a source of such a normally ON high-voltage switch and operable to turn the high-voltage switch off). Normally on transistors are transistors that are on (conductive) in the absence of a gate voltage. While not necessarily so limited, various aspects may be appreciated through the following discussion of non-limiting examples which use exemplary contexts.

Accordingly, in the following description various details are set forth to describe examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination. For instance, the additional capacitance/clamping functions illustrated with low voltage switches may be utilized with other circuitry shown herein. Where implemented with such a low voltage switch, the additional capacitance/clamping functions (and related circuitry) can be utilized with circuitry in addition and/or as an alternative to high voltage input switches as shown in the figures, such as with implementation for a variety of different types of circuits.

Various embodiments are directed to providing enhanced Coss (output or drain-source capacitance) and voltage clamp functions with a circuit/spacing construction that fulfils both of these roles. In various contexts, spacing between the circuitry and material (e.g., insulating) therein is set to fine tune clamping voltage. Such embodiments may be implemented with a normally ON transistor coupled to a low-voltage transistor to which the enhanced Coss is provided. For instance, a GaN (gallium nitride) normally ON transistor can be implemented with a low voltage FET (such as a MOSFET) with the enhanced Coss and voltage clamp. These approaches may be implemented, for example, to clamp the drain voltage of such a FET under conditions in which it is turning off, which can mitigate or prevent overvoltage conditions (and related avalanche) at its drain, as may otherwise be incurred as the normally ON transistor turns off rather rapidly.

Certain embodiments are directed a structure that functions as both additional capacitance and a clamp diode, to provide enhanced Coss and voltage clamping as noted above. In connection with such embodiments, it has been recognized/discovered that a single construction can achieve these effects, and further that such construction can be carried out during processing steps for forming adjacent transistors. Consistent with various embodiments, a series of deep trenches can be constructed to provide enhanced Coss using the same process that is used for edge terminations in low voltage devices on the same die. The trenches are connected to the source of a FET as above, which provide the enhanced/additional Coss. The trenches are also used with a p-body implant between each trench (e.g., carried out with a p-body implant for main structure) to define a diode between a series of these trenches.

In various embodiments, the breakdown voltage of such a structure is tuned to a desired value in order to provide a desired function, such as to protect the gate of a high voltage device such as a GaN device controlled by the FET and/or prevent the FET from avalanching. In one embodiment, additional implants (e.g., p or n-type) are utilized to modify the breakdown of a pn diode used as a voltage clamp. In another embodiment, the distance between the deep trenches is varied to set the breakdown voltage. In yet another embodiment, contacts with the deep trenches are defined to set the breakdown voltage, such as by providing less contact and/or contact to fewer trenches in a series of the trenches. Other embodiments employ combinations of two or more of the above, such as by adding implants and modifying deep trench distances, to tune breakdown voltage. Further approaches to setting breakdown voltage may include one or more of the following, which may also be implemented with one or more of the above: setting/changing trench depth (e.g., with capacitance being modified with trenches deeper than adjacent drift regions), varying drift region thickness, varying dopant concentration in one or more regions, and changing insulator thickness within the trenches.

Figure 4:
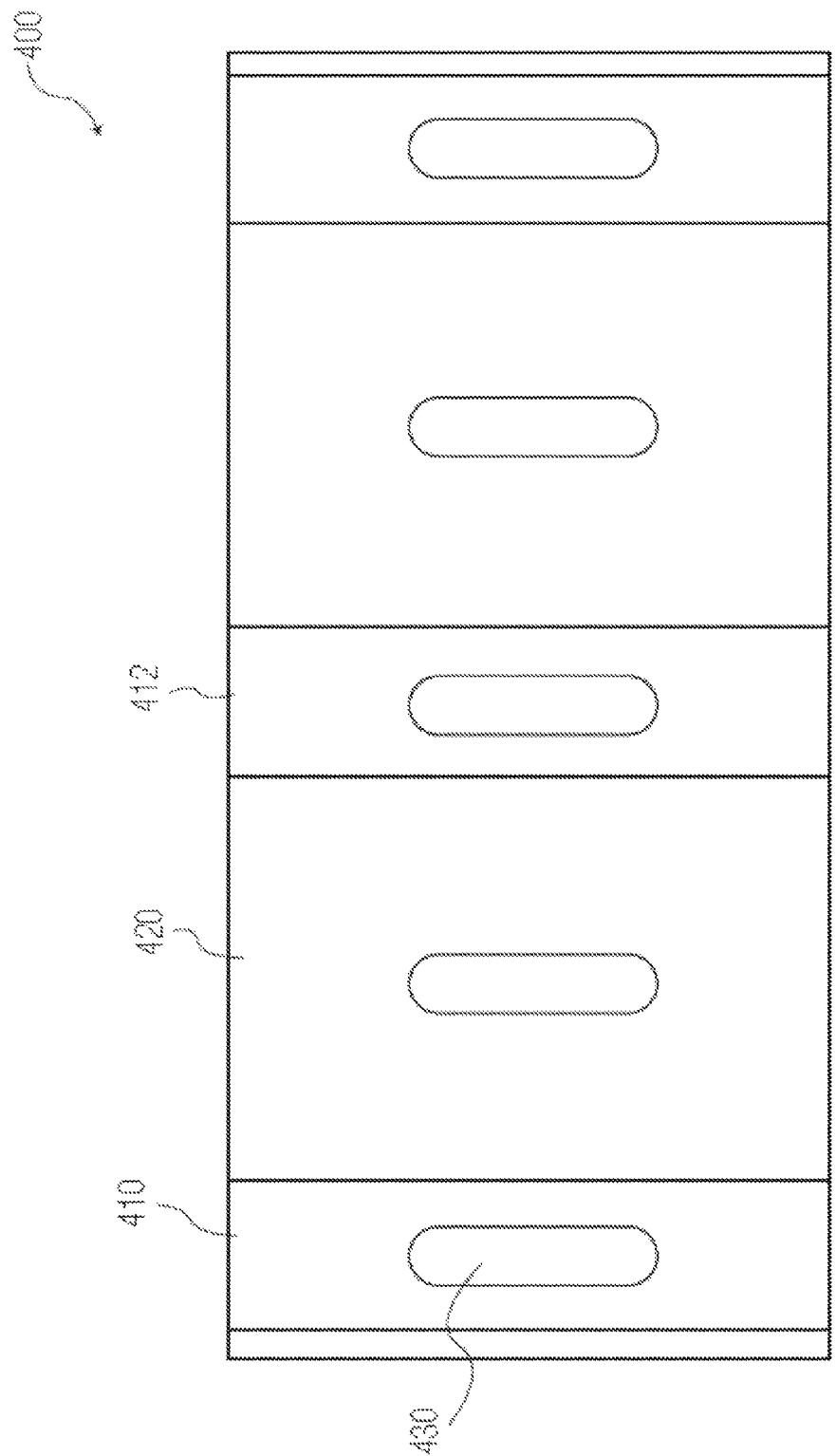
FIG. 4 shows a top view of an apparatus, in accordance with the present disclosure.

Various approaches herein may be implemented, for example, with low-voltage MOSFETs that may use RESURF (reduced surface field) principles to achieve a high breakdown voltage. For instance, the distance between the deep trenches can be increased (relative to an original design) to reduce the amount of RESURF in the structure (e.g., as shown in FIG. 4). Accordingly, various aspects involve circuitry and/or related systems/apparatuses that employ a voltage clamp in a cascode configuration (e.g., with a low voltage device), which utilizes a RESURF effect between two isolation trenches. This approach can be implemented to protect low voltage MOSFETs and gate of a connected switch (such as a GaN transistor) from damage due to repetitive avalanche. The voltage clamp also adds additional output capacitance which can be used to protect the device during voltage transients.

In some embodiments, a low-voltage MOSFET as characterized above is placed in the source of a high voltage device, in a cascode arrangement. The high voltage device may, for example, include a GaN HEMT (high electron mobility transistor) or an SiC JFET (silicon carbide junction gate field-effect transistor). When the low voltage MOSFET is turned off, a negative gate voltage is created in the normally on high voltage device, which turns (or maintains) it off (e.g., with the difference between the gate and the source (Vg-Vs) of the low-voltage MOSFET device being negative).

The drain-source voltage (VDS) of the low voltage MOSFET can be characterized by the threshold voltage of the normally on high voltage device and the capacitances of the two devices, as described in the formula below:

$$Vx = \frac{C_{DS(GaN)} \cdot V_d - (C_{OSS(MOS)} + C_{GS(GaN)}) \cdot V_{th(GaN)}}{C_{DS(GaN)} + (C_{OSS(MOS)} + C_{GS(GaN)})}$$

where Vx is the drain-source voltage of the MOSFET, $C_{DS(GaN)}$ is the drain-source capacitance of the GaN HEMT; $V_d$ is the maximum voltage rating of the GaN HEMT; $C_{GS(GAN)}$ is the gate source voltage of the GaN HEMT; and $V_{th(GAN)}$ is the threshold voltage of the GaN HEMT. It can be seen that Vx is dependent on the maximum voltage rating of the connected device (Vd); the threshold voltage $V_{th(GAN)}$ of the normally on (e.g., GaN) device (note since this is negative, the last term in the formula above will be a positive value); and the capacitances of the two devices $C_{DS(GaN)}$, $C_{GS(GAN)}$, and $C_{OSS(MOS)}$.

Various embodiments are directed to ensuring that Vx is low, or as low as possible, utilizing voltage clamping. This can help ensure that the maximum gate voltage of the normally on device is not exceeded, and can ensure that the low voltage MOSFET is not avalanched. For the latter, this can help long-term reliability. Further, this can help to ensure that the low voltage MOSFET is not avalanched in order to achieve true ZVS (zero-volt-switching) and improve efficiency in soft-switching applications. This can also help to optimize Coss-related reverse-recovery charge and minimize losses in hard switching applications. Coss can be further optimized by adding capacitance, which may also reduce Vx.

In accordance with a particular embodiment, an apparatus includes a cascode circuit having first and second transistors each having a gate, a source, channel and drain. The drain and source of the second transistor are connected to the source and gate of the first transistor, respectively. The ON/OFF state of the second transistor can therefore be used to control the ON/OFF state of the first transistor. Moreover, the second transistor can maintain the first transistor in the OFF state in the absence of a control signal to cause the circuit to operate as a normally-off circuit. A plurality of conductive trenches and at least one doped region between each pair of adjacent trenches, each doped region providing a p-n junction, provide capacitance across the source and the drain of the second transistor and mitigate avalanche breakdown of the second transistor by restricting a voltage level at one of the source and the drain of the second transistor. The conductive trenches may, for example, be coupled to the source of the second transistor by contacts extending from the source to the trenches. The doped regions may, for example, form part or all of a p-n diode (e.g., by forming both p and n regions of the diode, or by forming one of these regions as may interface with a different such p or n region). In some instances, the p-n junction can be formed at the intersection of the doped region and extended regions of the source and drain of the first transistor. In some implementations, the doped regions and trenches form diodes and capacitors coupled to the source and drain of the second transistor in parallel with the channel.

Various cascode applications can be facilitated in this regard. For instance, where the first transistor is a normally ON transistor, the second transistor controls the first transistor in an OFF state by coupling a voltage from its source to the gate of the normally ON transistor. The voltage drop across the second transistor sets a negative voltage difference between the gate and source of the normally ON transistor, maintaining the OFF state.

A variety of different types of semiconductor structures can be implemented to form the doped regions and trenches, relative to the transistor structures. In some embodiments, the doped regions and trenches may be implemented in parallel with the channel of the second transistor, with the trenches are arranged laterally adjacent one another with the doped regions laterally between the trenches. In various embodiments, the source of the second transistor includes a doped layer extending over the trenches and the doped regions, the drain of the second transistor includes a second doped layer extending below the doped regions, and the trenches extend between the doped regions and into the second doped layer. In this context, the doped regions can be formed as part of a common implant process used to form the transistors, facilitating lean processing and simplicity.

In some embodiments, a first transistor as noted above is a high voltage transistor, and the second transistor is a low voltage transistor. High voltage in this context relates to a transistor that has a higher threshold voltage than the low voltage transistor, such as a power MOSFET, such as a GaN HEMT or a SiC JFET. This approach facilitates control with the low voltage transistor while realizing the benefits of the high voltage transistor. The second transistor switches the first transistor from an ON state to an OFF state by setting a negative gate-source voltage differential of the first transistor, while the doped regions restrict the voltage level at the drain of the second transistor relative to a clamp-voltage threshold level. This approach can facilitate switching and protection of the low-voltage transistor, such as when the timing of the switching may otherwise result in a high voltage being applied to the second transistor, via the increased capacitance and voltage clamping. For instance, the trenches and doped regions may restrict a voltage drop across the source and drain of the second transistor while the second transistor is switched from an ON state to an OFF state. As such, the second transistor can turn the first transistor off by coupling a voltage to a gate of the first transistor that provides a negative voltage difference between the gate and source of the normally ON transistor, with protection from undesirable overvoltage conditions.

Another embodiment is directed to a method, which may be implemented with circuitry as noted above. First and second transistors are provided, each having a gate, a source, a channel and a drain, and a plurality conductive trenches with the trenches separated by one or more doped regions are provided connected to the source and drain of the second transistor. The second transistor is utilized for controlling the first transistor in an off state by applying a voltage to the gate of the first transistor, and the trenches and the doped regions are used to both provide capacitance across the source and the drain of the second transistor and mitigate avalanche breakdown of the second transistor. Avalanche breakdown can be mitigated in this context by limiting (e.g., clamping) voltage at one of the source and the drain of the second transistor.

The doped regions and trenches can be tuned to set characteristics of operation of the second transistor. For instance, doped regions may be doped with a dopant and quantity chosen to set a breakdown voltage between the drain and channel. The trenches can be set at a distance that tunes/sets a breakdown voltage between the drain and channel. A combination of doping and channel distance can be used together to tune, or set, breakdown voltage of the second transistor.

Turning now to the figures, FIG. 1 shows an apparatus 100 with respective switching circuitry including a first (switch) circuit 110, second (switch) circuit 120, and a third circuit 130 that operates to both clamp Vx as shown and provide additional capacitance across the second circuit 120. In some implementations, the first circuit 110 includes or is a GaN transistor, and the second switch 120 includes or is an NMOS transistor. As also shown by way of further example, the third circuit 130 may include a capacitive circuitry 131 and diode circuit 132.

The apparatus 100 can be operated in a variety of manners. In some embodiments the second circuit 120 is an NMOS transistor coupled to the source of the first circuit 110 (as a GaN transistor), and operates to provide control of the gate of the first circuit 110, as coupled at node 121. The second circuit 120 is responsive to a control signal Vg and the cascode configuration ensures that the first circuit 110 is OFF when Vg is not being actively driven. Capacitive circuitry 131 and diode 132 operate to respectively enhance capacitance across drain 122 and source 123 of the NMOS transistor, and to clamp Vx, while the NMOS transistor switches to an off state and therein switches the GaN transistor off. In some embodiments, the capacitive circuitry 131 and diode circuit 132 are implemented between two isolation trenches, protecting the NMOS transistor from damage due to repetitive avalanche, and the voltage clamping effect further adds output capacitance that protects during voltage transients. The trenches create additional Coss and the diode effects the clamping to prevent the MOSFET from avalanching. The capacitive circuitry 131 and diode circuit 132 may be connected to the drain and the source of the MOSFET in parallel with the active area of the MOSFET.

Accordingly, with the first circuit 110 implemented as a GaN transistor and second circuit 120 as an NMOS transistor, the threshold voltage of the GaN transistor is negative when GaN device is off, and the difference between the gate and the source (Vg-Vs) of the GaN transistor is negative. The voltage of the source of the GaN device ($Vs_{GaN}$) that is connected to the drain of the MOSFET 120 is a positive value, and the voltage of the gate of the GaN device ($Vg_{GaN}$) that is connected to the source of the MOSFET is some value (e.g., 0) lower than the drain voltage of the MOSFET. The voltage difference between the gate and source ($Vg_{GaN}-Vs_{GaN}$) of the GaN device is thus negative.

The respective circuit components shown in FIG. 1 may be connected and implemented in a variety of manners. In some embodiments, the drain 122 is connected by a bond wire to the source of GaN transistor 110, and the source 123 is connected by another bond wire to the gate of GaN transistor 110. Clip bonding can be similarly used to make these connections. In other embodiments, GaN transistor 110 and NMOS transistor 120 are implemented in a common substrate/chip, along with third circuit 130, with metal layer connections therein.

Various embodiments are directed to circuit 130 in which the capacitive circuitry 131 and diode circuit 132 are part of a single structure that provides both functions. Such a circuit can be coupled to a variety of other types of circuits or devices, and functions accordingly. Other embodiments are directed to circuit 130 as implemented with circuit 120, with the capacitive circuitry 131 and diode circuit 132 providing enhanced capacitance and voltage limiting/clamping for the (transistor) circuit 120. The circuit 120 can then be implemented with a variety of different types of circuits, utilizing the circuit 130 for capacitive and clamping control.

Figure 2:
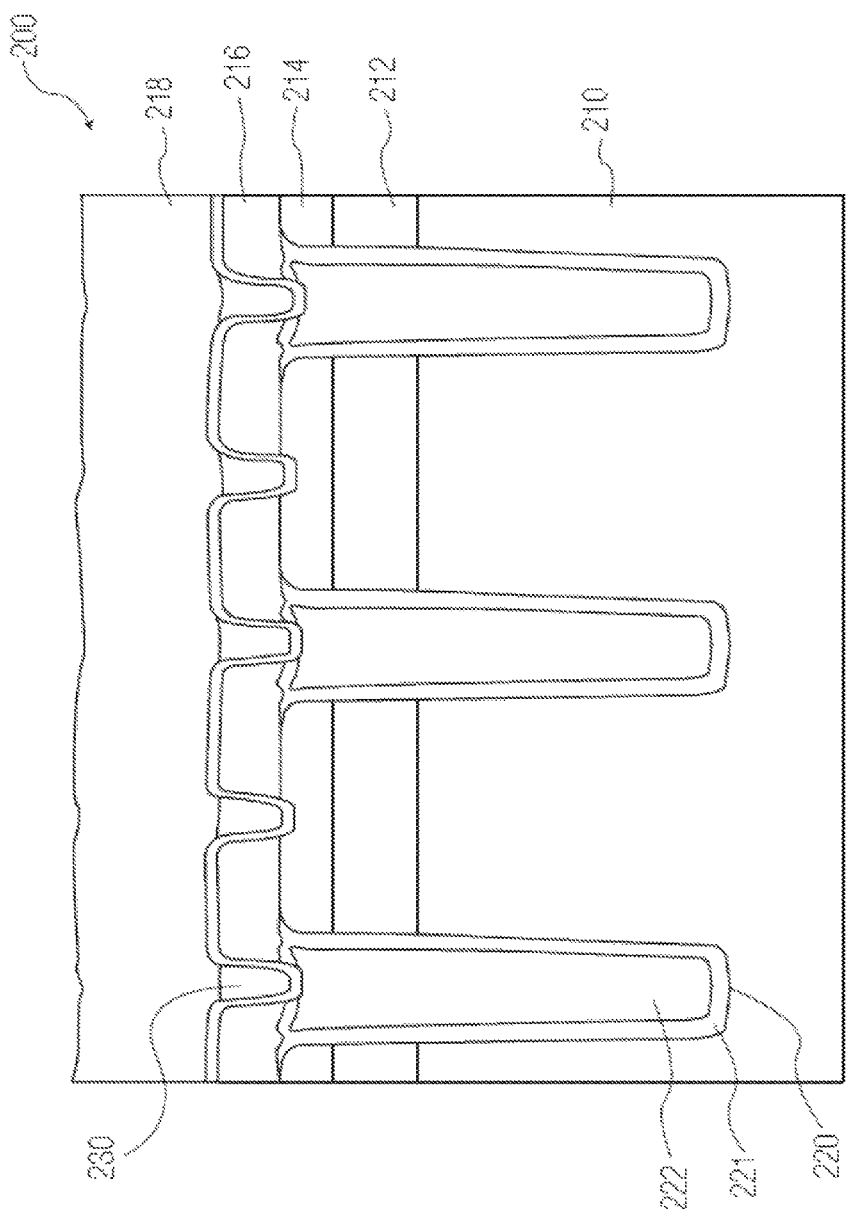
FIG. 2 shows a cross-sectional view of an apparatus, in accordance with the present disclosure.

FIG. 2 shows a cross-sectional view of an apparatus 200, in accordance with the present disclosure. The apparatus 200 includes a doped substrate 210, episilicon layer 212 (e.g., a drift region), a body implant layer 214, an insulating layer 216 and conductive layer 218. For instance, doped substrate 210 and episilicon layer 212 may be n, n− or N+, with the body implant layer 214 being p or P+. Deep trenches including trench 220 extend from between portions of the body implant layer 214 into the doped substrate 210. For various applications, these deep trenches are formed to a shallower depth, such as by stopping in the episilicon layer 212. The trench 220 is lined with an insulating material 221 and further filled with conductive material 222. Contacts (including 230) couple the conductive layer 218 to the trenches and the body implant layer 214. RESURF implants may also be added for certain embodiments, extending from the body implant layer 214 to the doped substrate 210. In various embodiments, the RESURF implants are not used. With the doped substrate 210 coupled to (or being part of) the drain of a MOSFET, and the conductive layer 218 coupled to (or being part of) the source of the MOSFET, the trenches and body implant layer portions (acting as diodes), voltage at the drain is claimed and drain-source capacitance is enhanced.

In some embodiments, the contact 230 between the conductive layer 218 (e.g., source) and conductive trench 220 is not continuous or omitted. For instance, multiple contacts may be spaced across the device and separated by sections where the conductive trench is not directly connected to the conductive layer 218. An R-C circuit is formed in this regard, and can be implemented to mitigate voltage oscillations between the conductive layer 218 and the doped substrate 310 (e.g., between source and drain of an adjacent FET).

In various embodiments, an array of trenches is used to provide capacitance. Such an array can be implemented, for example, with trenches as shown in FIG. 2. Certain applications involve such an array in which p-n junctions are formed between adjacent trenches as shown in FIG. 2 (e.g., between a p body region at 214 and underlying region 212/210) or otherwise, and in which some regions between adjacent trenches do not include such a p-n junction. This approach may be useful for creating increase capacitance and/or reduced junction leakage.

Figure 3:
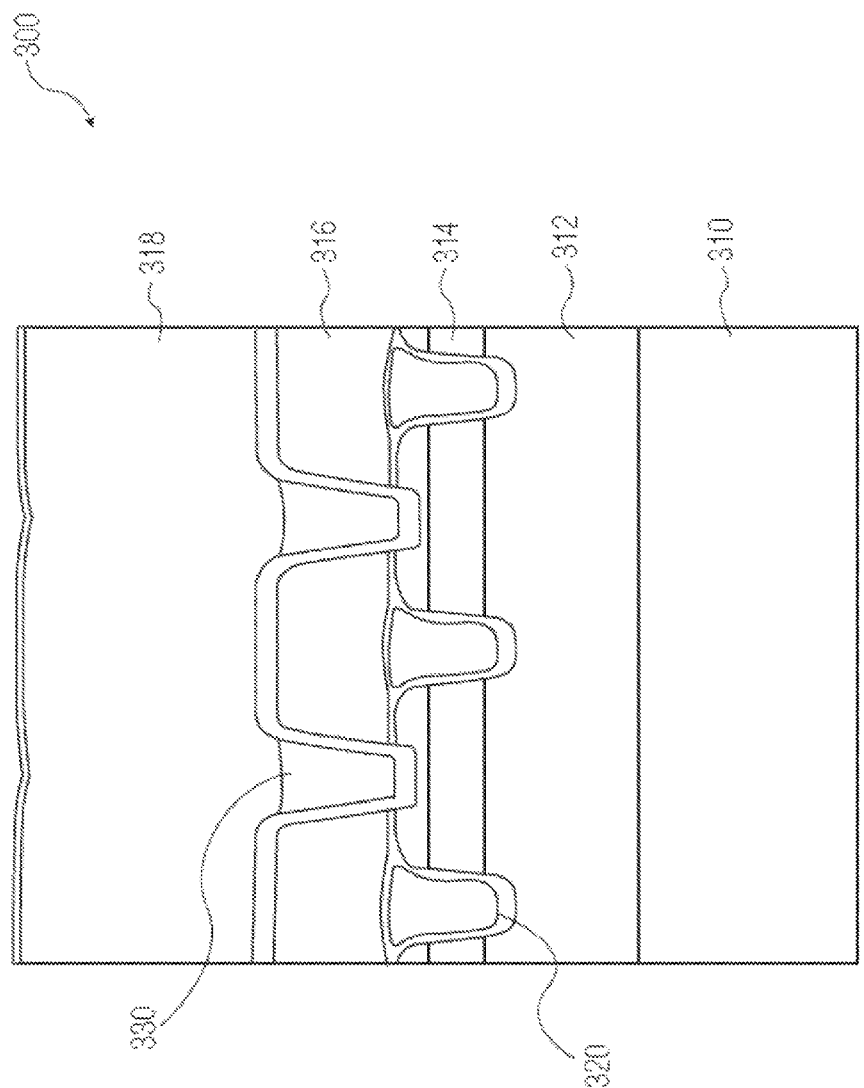
FIG. 3 shows a cross-sectional view of an apparatus, in accordance with the present disclosure.

FIG. 3 shows a cross-sectional view of an apparatus 300, in accordance with the present disclosure. Various aspects of FIG. 3 can be implemented with the apparatus of FIG. 2, with certain portions labeled similarly in this context. The apparatus 300 includes a doped substrate 310, episilicon layer 312, a body implant layer 314, an insulating layer 316 and conductive layer 318. Similar to FIG. 2, doped substrate 310 and episilicon layer 312 may be doped N+, with the body implant layer 314 being P+. Shallow active trenches including trench 320 extend from between portions of the body implant layer 314 into the episilicon layer 312. Contacts (including 330), which may be optionally implemented with p-body implant regions (e.g., RESURF regions) below, and couple the conductive layer 318 to the body implant layer 314. Certain embodiments involve no RESURF structures, and some involve split-gate or stepped oxide components to provide high breakdown voltage.

In one or more embodiments, the apparatus 200 shown in FIG. 2 is implemented in parallel with the apparatus 300 shown in FIG. 3, with both being connected between a source (conductive layers 218/318) and drain (doped substrates 210/310). In this context, each of apparatuses 200 and 300 can be coupled to common source and drain regions, with source (218/318) and drain (210/310) being shared and the respective apparatuses 200 and 300 being in parallel with one another. For instance, the apparatus as shown in FIG. 3 can be implemented with an active area of a transistor structure, and the apparatus shown in FIG. 2 can be implemented in an edge termination region of the same transistor structure.

In the cross-sectional views herein, certain doped regions are shown and characterized with respective dopant types. However, it should be understood that various regions, such as drift regions (e.g., at 212), can be doped with different polarities while achieving a desired structure (e.g., p-n junction forming a diode). Accordingly, various embodiments are directed to such structures as may be implemented with doping that is different than what is shown by way of example.

FIG. 4 shows a top view of an apparatus 400, in accordance with the present disclosure. The apparatus 400 may be implemented in accordance with apparatus 200 of FIG. 2, with edge termination. The apparatus includes trench regions including trenches 410 and 412, and body implant regions 420 therebetween. Contacts including contact 430 extend into each trench region and body implant region. For certain applications, contact to an underlying diode is continuous. In other applications, contact area is limited to provide a voltage clamp in areas in which the contact is not present.

Figure 5:
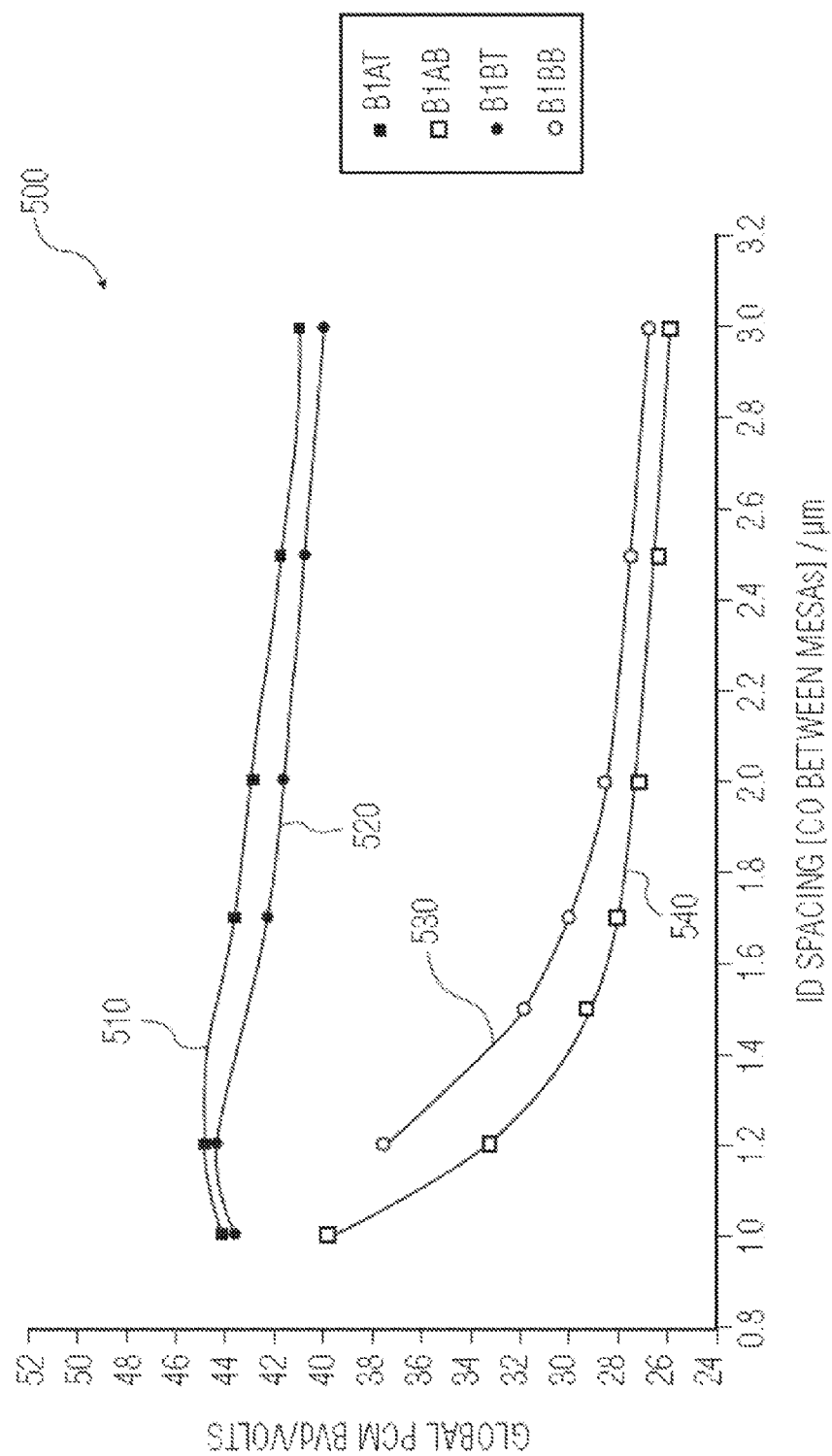
FIG. 5 shows plots characterizing example trench spacing and related breakdown voltage, as may be implemented in accordance with one or more embodiments.

FIG. 5 shows plots characterizing example trench spacing and related breakdown voltage, as may be implemented in accordance with one or more embodiments. The vertical axis characterizes a resulting breakdown voltage, and the horizontal axis characterizes spacing between trenches. Plots 510 and 520 show variation for similar doping profiles, and plots 530 and 540 show variation for doping profiles that are similar to one another but different than that of plots 510 and 520.

Terms to exemplify orientation, such as upper/lower, left/right, top/bottom and above/below, may be used herein to refer to relative positions of elements as shown in the figures. It should be understood that the terminology may be used for notational convenience only and that in actual use the disclosed structures may be oriented different from the orientation shown in the figures (for instance, structures characterized as being laterally arranged relative to one another may be stacked vertically, with similar results). Thus, the terms should not be construed in a limiting manner.

The skilled artisan would recognize that various terminology as used in the Specification (including claims) connote a plain meaning in the art unless otherwise indicated. As examples, the specification describes and/or illustrates aspects useful for implementing the claimed disclosure by way of various circuits or circuitry. These circuits or circuitry may be illustrated as or using terms such as blocks, modules, device, system, unit, controller, clamp and/or other circuit-type depictions (e.g., reference numerals 110, 120 and 130 of FIG. 1 may depict a block/module in this context). Such circuits or circuitry are discussed as being used together with other elements to exemplify how certain embodiments may be carried out in the form or structures, steps, functions, operations, activities, etc. As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to clamp . . . " is interpreted as "circuit configured to clamp . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. The respective trenches and layers as shown may be formed in different orders or with different arrangements to achieve a particular effect. As another example, different types of high voltage devices can be utilized with low voltage switches and related componentry that effects both clamping and capacitance enhancement. Such modifications do not depart from the true spirit and scope of various aspects of the disclosure, including aspects set forth in the claims.

What is claimed is:

1. An apparatus comprising:
a cascode circuit susceptible to overvoltage conditions including avalanche breakdown, the cascode circuit including:
a first transistor having a gate, a source, a channel and a drain; and
a second transistor having a gate, a source, a channel and a drain electrically connected to the source of the first transistor, the second transistor being configured and arranged to control the first transistor in an off state by applying a voltage to the gate of the first transistor;
a plurality of conductive trenches; and
a set of one or more doped regions, each doped region being between a respective adjacent pair of the conductive trenches and configured to provide a p-n junction, wherein the plurality of conductive trenches and one or more doped regions are configured and arranged with the cascode circuit to provide capacitance across the source and the drain of the second transistor and to mitigate avalanche breakdown of the second transistor by restricting a voltage level at the source or the drain of the second transistor,
wherein the one or more doped regions and the conductive trenches are part of a circuit connected to the source and drain of the second transistor in parallel with the channel of the second transistor, and the conductive trenches are arranged laterally adjacent one another with the one or more doped regions laterally between the conductive trenches.

2. The apparatus of claim 1, wherein
the source of the second transistor includes a first doped layer extending over the conductive trenches and the doped regions;
the drain of the second transistor includes a second doped layer extending below the doped regions; and
the conductive trenches extend between the one or more doped regions and into the second doped layer.

3. The apparatus of claim 1, wherein:
the first transistor is a high voltage transistor having a high breakdown voltage, and
the second transistor is a low voltage transistor having a low breakdown voltage that is lower than the high breakdown voltage, the second transistor having its drain coupled to the source of the first transistor, the second transistor being configured and arranged to switch the first transistor from an ON state to an OFF state by setting a negative gate-source voltage differential of the first transistor while the one or more doped regions restrict the voltage level at the drain of the second transistor relative to a clamp-voltage threshold level.

4. The apparatus of claim 1, wherein the conductive trenches are coupled to the source of the second transistor by contacts extending from the source of the second transistor to the conductive trenches.

5. The apparatus of claim 1, wherein:
the first transistor is a normally ON transistor, and
the second transistor is configured and arranged to control the first transistor in an OFF state by coupling a voltage from its source to the gate of the normally ON transistor that provides a negative voltage difference between the gate and source of the normally ON transistor.

6. The apparatus of claim 1, wherein each doped region is part of a p-n diode including the doped region and extended regions of the source and drain of the first transistor, each p-n diode having a portion thereof separated by one of the conductive trenches.

7. The apparatus of claim 1, wherein the conductive trenches and the one or more doped regions are configured and arranged to restrict a voltage drop across the source and drain of the second transistor while the second transistor is switched from an ON state to an OFF state and while the second transistor turns the first transistor off by coupling a voltage to a gate of the first transistor that provides a negative voltage difference between the gate and source of the first transistor.

8. The apparatus of claim 1, wherein
the first transistor is a normally-on circuit, and
the second transistor is configured and arranged to operate the normally-on circuit in a normally-off state.

9. The apparatus of claim 1, wherein the one or more doped regions and the conductive trenches form diodes and capacitors that are connected in parallel between the source and drain of the second transistor.

10. The apparatus of claim 1, wherein the one or more doped regions are configured and arranged with dopants therein to set a breakdown voltage between the drain and channel of the second transistor.

11. The apparatus of claim 1, wherein the conductive trenches are configured and arranged at a distance therebetween to set a breakdown voltage between the drain and channel of the second transistor.

12. The apparatus of claim 1, wherein the conductive trenches and the one or more doped regions are configured and arranged to set a breakdown voltage between the drain and channel of the second transistor via dopants in the one or more doped regions and a distance at which the conductive trenches are spaced.

13. An apparatus comprising:
a transistor having a gate, a source, a channel and a drain; and
a plurality of conductive trenches and at least one doped region that is between each laterally adjacent pair of the conductive trenches and that is configured to provide a p-n junction, wherein the plurality of conductive trenches and at least one doped region are configured and arranged to provide capacitance across the source and the drain and to mitigate avalanche breakdown of the transistor by restricting a voltage level at the source or the drain,
wherein the at least one doped region and the plurality of conductive trenches are part of a circuit connected to the source and drain of the transistor in parallel with the channel of the transistor.

14. The apparatus of claim 13, wherein the drain is electrically coupled to a source of a further cascode transistor, and wherein the transistor is configured and arranged to control the further cascode transistor in an off state by coupling a voltage from the source of the transistor to a gate of the further cascode transistor.

* * * * *

UNITED STATES PATENT AND TRADEMARK OFFICE
CERTIFICATE OF CORRECTION

PATENT NO. : 9,941,265 B2
APPLICATION NO. : 15/200308
DATED : April 10, 2018
INVENTOR(S) : Rutter et al.

It is certified that error appears in the above-identified patent and that said Letters Patent is hereby corrected as shown below:

On the Title Page

Item (73), Under "Assignee", please correct: "Nexperia B.V., Nimegen (NA)" to -- Nexperia B.V., Nijmegen (NL) --.

Signed and Sealed this
Fifteenth Day of May, 2018

Andrei Iancu
*Director of the United States Patent and Trademark Office*